United States Patent [19]
Ueno et al.

[11] Patent Number: 5,421,905
[45] Date of Patent: Jun. 6, 1995

[54] METHOD FOR WASHING WAFERS

[75] Inventors: Kinya Ueno, Nirasaki; Hiroki Taniyama, Kofu, both of Japan

[73] Assignee: Tokyo Electron Limited, Tokyo, Japan

[21] Appl. No.: 120,813

[22] Filed: Oct. 13, 1993

Related U.S. Application Data

[62] Division of Ser. No. 862,357, Apr. 2, 1992, Pat. No. 5,261,431.

[30] Foreign Application Priority Data

Apr. 2, 1991 [JP] Japan ................................. 3-69808

[51] Int. Cl.$^6$ .............................. B08B 1/02; B08B 3/02
[52] U.S. Cl. ....................................... 134/25.4; 134/26; 134/32; 134/34; 134/15; 134/25.1
[58] Field of Search ................. 134/25.1, 902, 66, 76, 134/77, 78, 79, 104.1, 137, 140, 164, 165, 196, 26, 32, 34, 15, 25.4

[56] References Cited

U.S. PATENT DOCUMENTS

| | | | |
|---|---|---|---|
| 4,560,417 | 12/1985 | Bardina et al. | 134/26 |
| 4,924,890 | 5/1990 | Giles et al. | 134/902 X |
| 4,936,328 | 6/1990 | Yatabe | 134/902 X |
| 4,974,619 | 12/1990 | Yu | 134/902 X |

FOREIGN PATENT DOCUMENTS 60-5530 12/1985 Japan ................................. 134/902

Primary Examiner—George Wyszomierski
Assistant Examiner—Zeinab El-Arini
Attorney, Agent, or Firm—Oblon, Spivak, McClelland, Maier, & Neustadt

[57] ABSTRACT

A method for washing a group of semiconductor wafers in which a first support arrangement is provided for supporting the wafer group to be immersed in a solution, with a second support carrying the wafer group to the treatment vessel. The second support can be provided, for example, in the form of a fork arrangement, and the wafer group is transferred from the second support to the first support for treatment or washing in the treatment vessel. After the wafer group is pulled from the treatment solution, the wafer group is transferred from the first support to the second support and carried outside of the treatment vessel and transferred from the second support. Water is then sprayed onto the second support by moving a water washing nozzle along support rod(s) of the second support, and by blowing a drying gas along the second support while the second support is not carrying wafers thereon, and the next wafer group can then be supported by the clean second support.

6 Claims, 12 Drawing Sheets

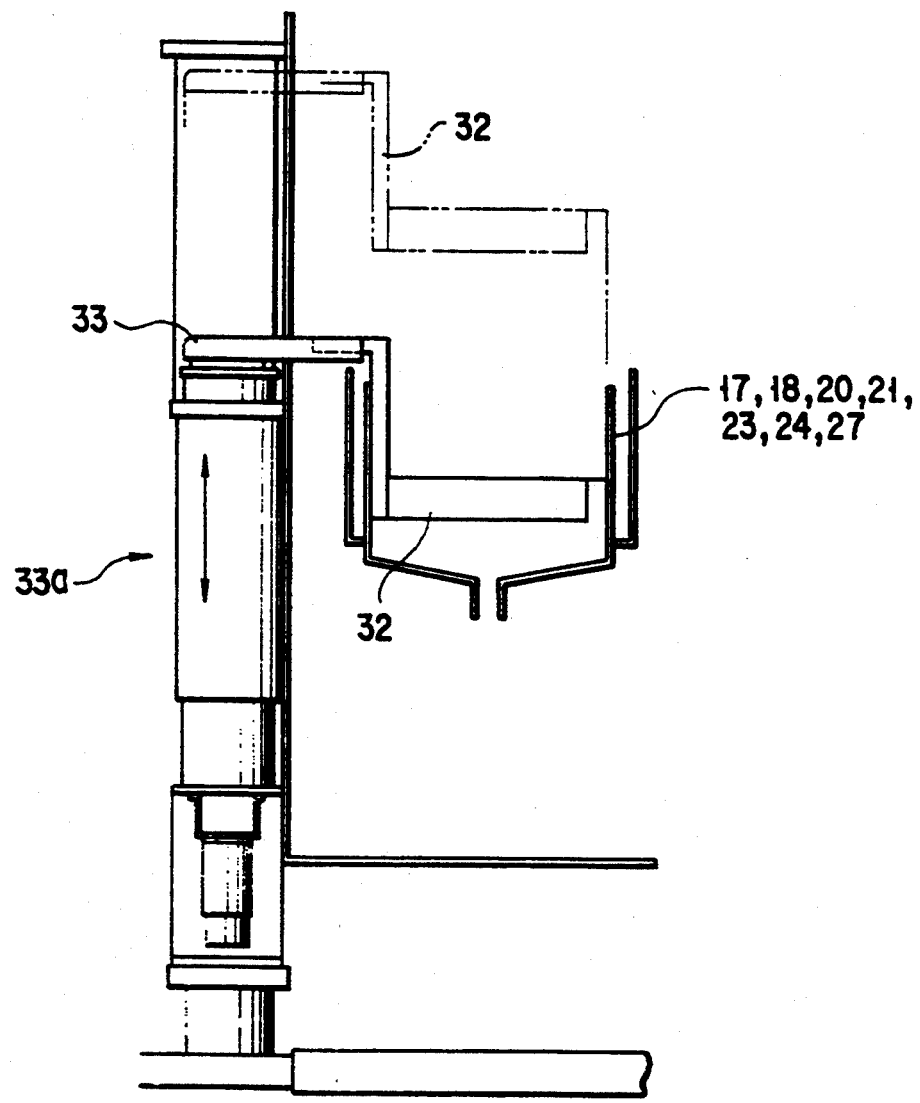
F I G. 3

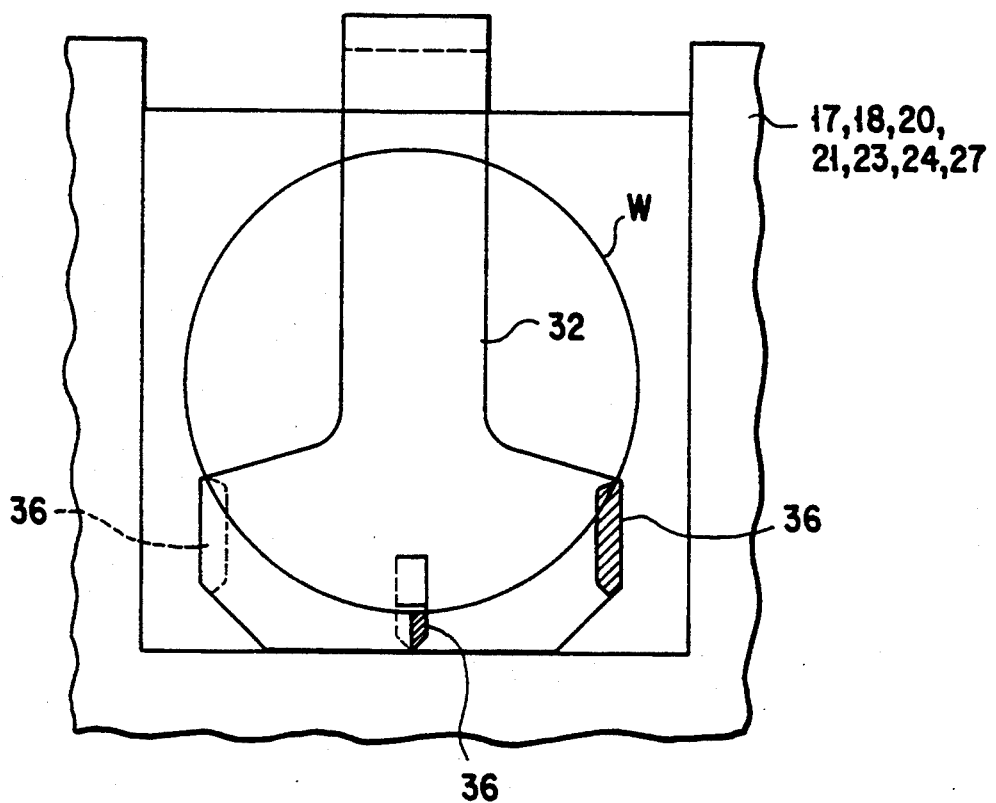
F I G. 8
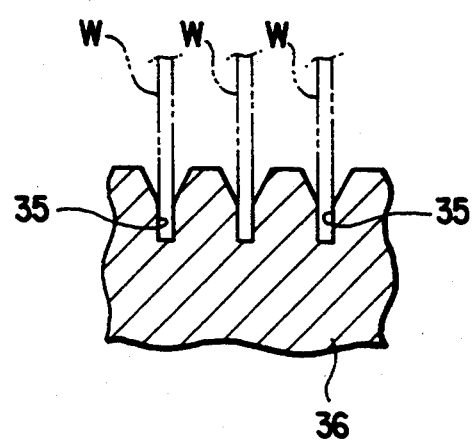
F I G. 6

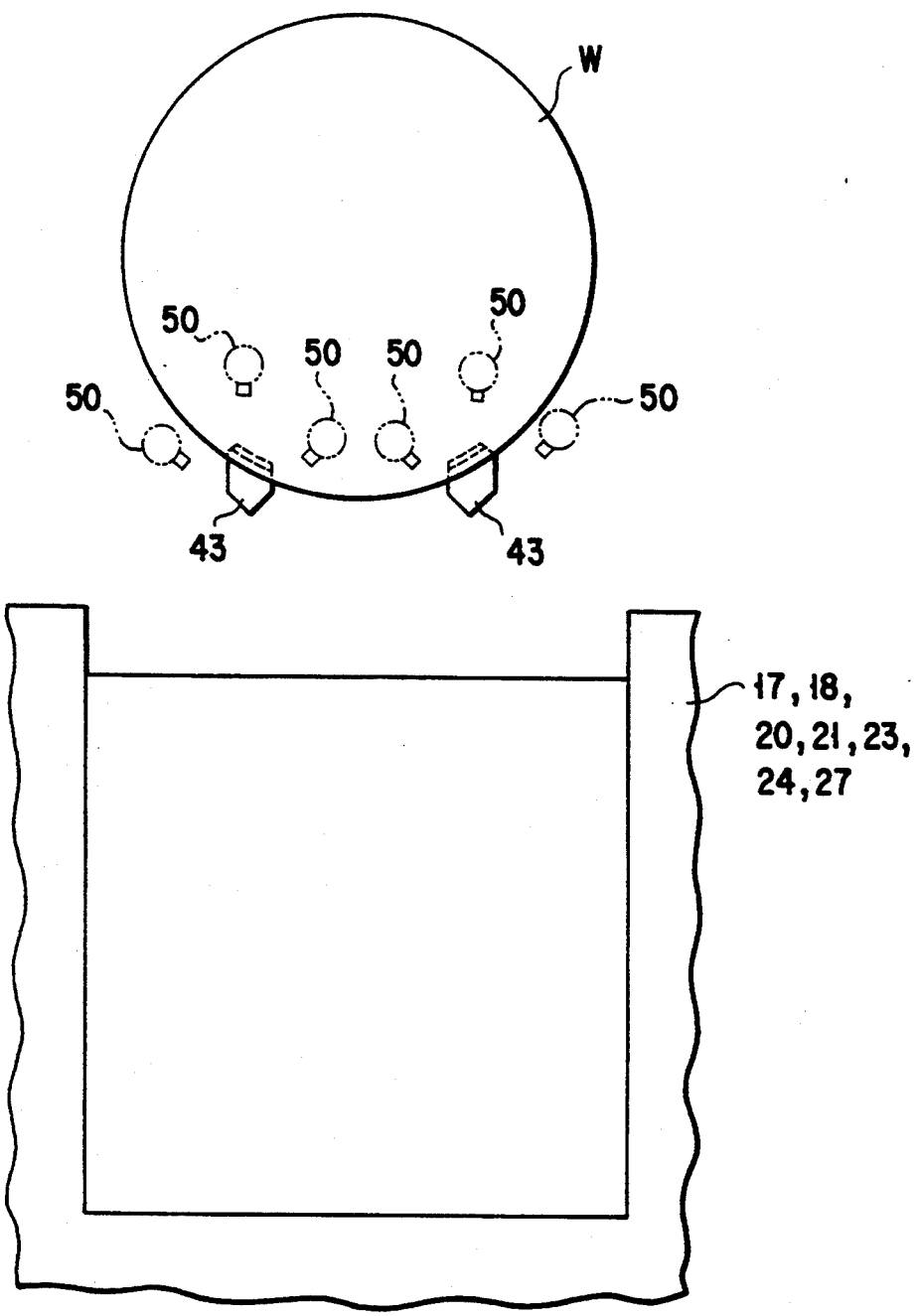
F I G. 12

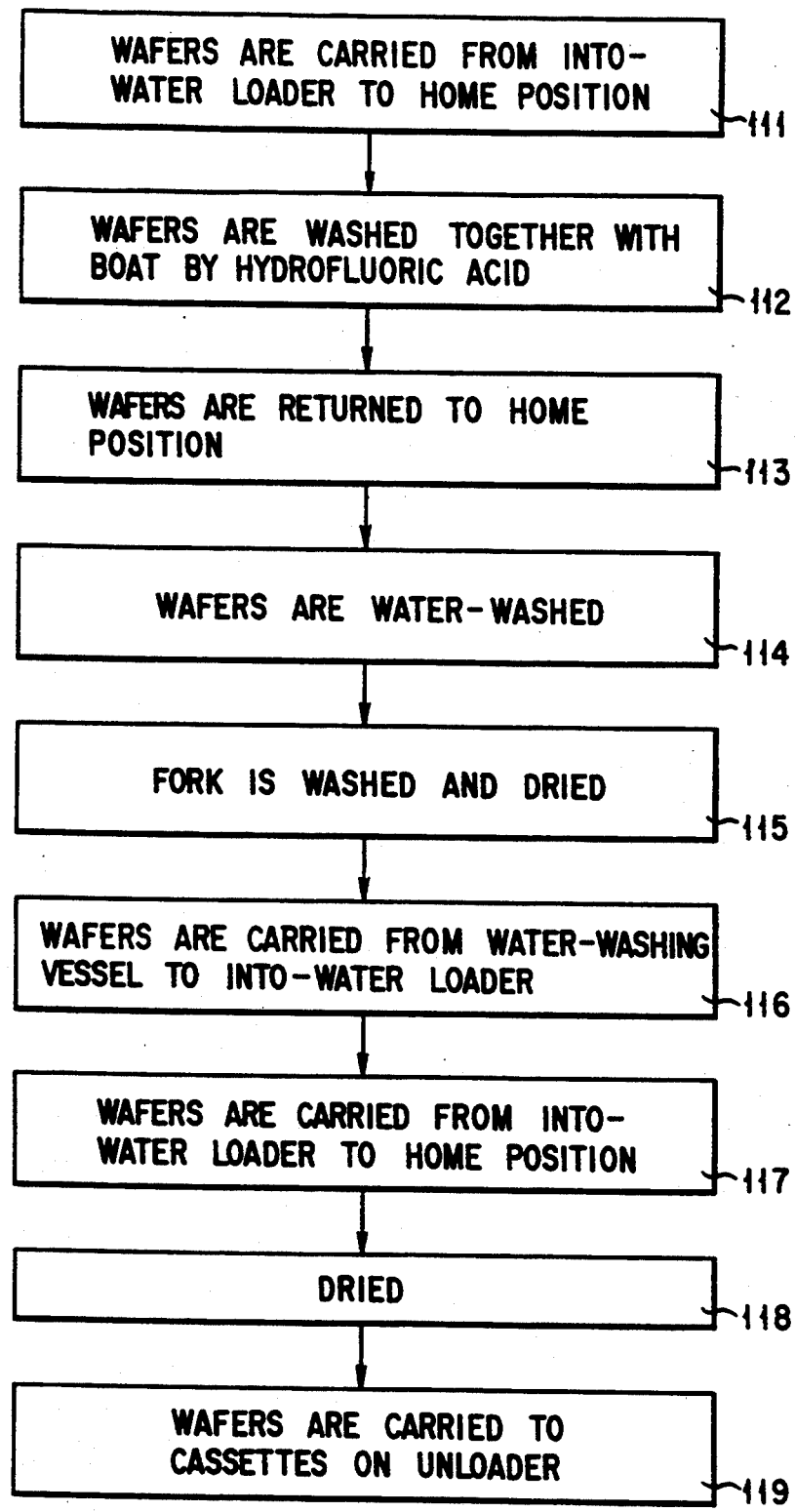
F I G. 15

METHOD FOR WASHING WAFERS

This is a division of application Ser. No. 07/862,357, filed on Apr. 2, 1992, now U.S. Pat. No. 5,261,431.

BACKGROUND OF THE INVENTION

1. Field of the Invention

The present invention relates to an apparatus and method for washing semiconductor wafers and others with chemical solution and water and drying them with dry air.

2. Description of the Related Art

The automatic washing apparatus is well-known as means for washing semiconductor wafers with chemical solutions. This automatic washing apparatus has plural processing sections where the semiconductor wafers can be washed with chemical solutions and water and then dried. More specifically, it includes ammonia-washing, water-washing, hydrofluoric-acid-washing and drying vessels so as to successively apply a series of processing steps to the semiconductor wafers, for example.

When the conventional washing apparatus is used to wash the semiconductor wafers, a plurality of the semiconductor wafers (or 25 sheets of them, for example) are housed in a cassette and they are immersed together with the cassette in chemical solutions in chemical washing vessels. The wafer cassette is then pulled out of the chemical washing vessel, washed with water and dried. In the case, wafer cassette may be dipped in heated chemical solution or heated water.

The wafer cassette is made of fluorine system resin (Trade Mark PFA). This resin is excellent in acid resistance and alkali resistance. However, the wafer cassette is complicated in shape and large in surface area, having a plurality of grooves to hold the wafers therein. When it is repeatedly immersed into alkali and acid, therefore, its material (or fluorine system resin) permeates little by little into the chemical solutions, and dissolves then in the solutions, thereby deteriorating to contaminate them in the processing vessels.

Semiconductor devices have been more highly integrated and their circuit patterns have been made finer and finer these days. When the chemical solutions are deteriorated by the contamination, their capacity of washing the semiconductor wafers is lowered, thereby disturbing the formation of super-fine patterns on each of the wafers. When a great many semiconductor wafers each having super-finely patterned chips are to be processed, therefore, the chemical solutions in the vessels must be replaced by new ones for a short time.

SUMMARY OF THE INVENTION

The object of the present invention is therefore to provide washing apparatus and method capable of keeping chemical solutions in washing vessels not deteriorated even when they are continuously used for a long time.

According to an aspect of the present invention, there can be provided a washing apparatus comprising plural washing vessels each containing a chemical solution for cleaning or washing objects to be washed; a first support means housed in each washing vessel to support the objects and immersed together with the matters in the chemical solution; and a means for carrying the objects into and out of the washing vessel.

The carrying-in and -out means includes a second support means for supporting the objects and loading and unloading them to and from the first support means.

The carrying-in and -out means further includes a means for washing and drying the second support means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a vertically-sectioned view showing the washing vessel and a lifter system partly cut-away;

FIG. 6 is a vertically-sectioned view showing a part of the wafer boat;

FIG. 8 is a vertically-sectioned view showing the boat and wafers immersed in the solution of the vessel;

FIG. 12 is a vertically-sectioned view showing the fork and the wafer pulled out of the vessel;

FIG. 15 is a flow chart showing the second half of the washing process.

DETAILED DESCRIPTION OF THE PREFERRED EMBODIMENTS

A case where a washing apparatus according to the present invention is used to wash semiconductor wafers will be described with reference to the accompanying drawings.

Figure 1:
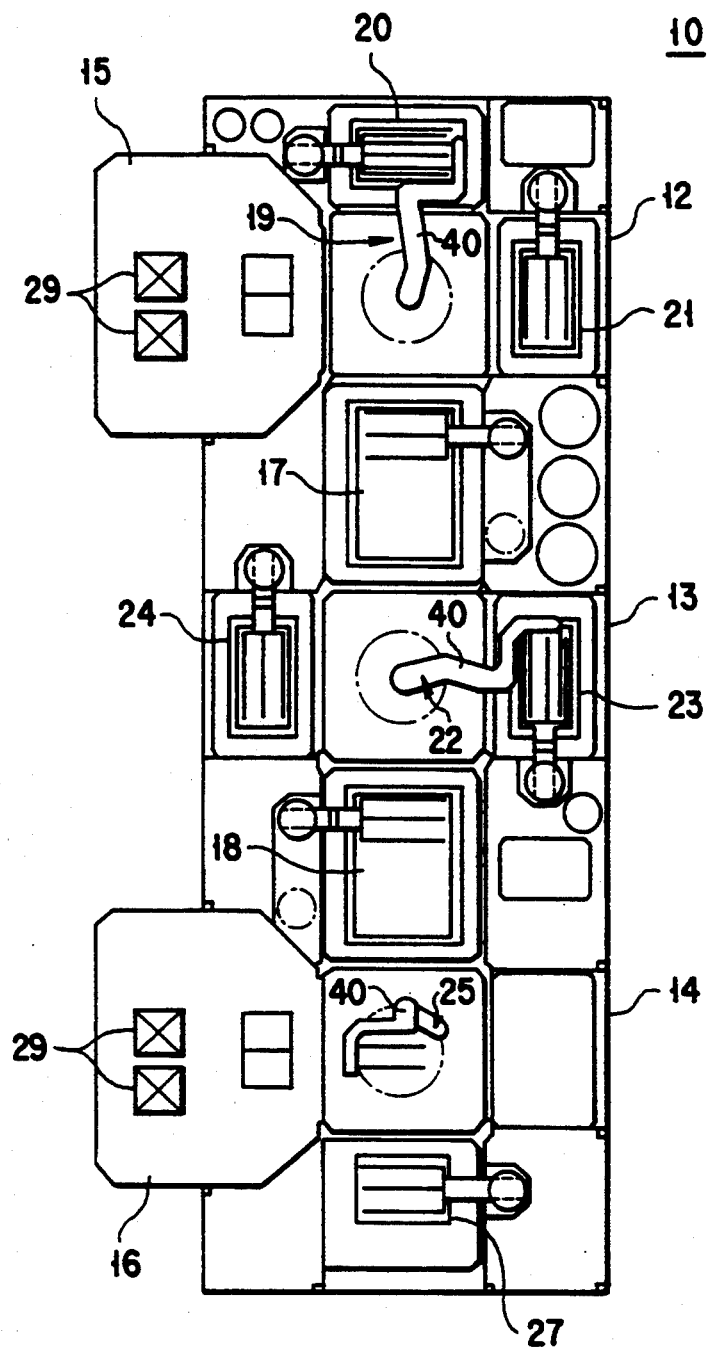
FIG. 1 is a plan view showing the whole of the washing system according to an embodiment of the present invention.

As shown in FIG. 1, a washing system 10 is a combination of three washing units 12, 13 and 14. The three washing units 12, 13 and 14 are arranged like a straight line in this order. The first washing unit 12 is provided on that side of the washing system 10 where semiconductor wafers W are received into the washing system 10. The first washing unit 12 includes a loader 15 provided with a stage.

The third washing unit 14 is provided on that side of the washing system 10 where the semiconductor wafers W are taken out from the washing system 10. The third washing unit 14 includes an unloader 16 provided with a stage.

An into-water loader 17 is arranged between the first 12 and the second washing unit 13. Another into-water loader 18 is also arranged between the second 13 and the third washing unit 14. The first into-water loader 17 belongs to the first washing unit 12 and the second into-water loader 18 to the second washing unit 13.

A carrier means 19 provided with a multi-joint arm 40 is located at the center (or home position) of the first washing unit 12. The base of the carrier means is connected to the drive shaft of a stepping motor (not shown) and the arm 40 is arranged rotatable round the base of the carrier means 19 and extensible from the base thereof. A wafer fork 41 is supported by the arm 40.

Two washing vessels 20 and 21 are located adjacent to the carrier means 19. In the case of this example, ammonia solution is contained, as process liquid, in the washing vessel 21 and water is contained, as washing liquid, in the washing vessel 20. The water washing vessel 20 is used for the so-called Quick Dump Rinse to wash out ammonia liquid on the semiconductor wafers W.

A carrier means 22 is also located at the center (or home position) of the second unit 13. The carrier means 22 is same as the carrier means 19.

Two washing vessels 23 and 24 are located adjacent to the carrier means 22 at the home position of the second unit 13. In short, the two washing vessels 23, 24 and the two into-water loaders 17, 18 are located enclosing the home position of the second unit 13.

In the case of this example, hydrofluoric acid is contained, as process liquid, in the vessel 23 and water is contained, as washing liquid, in the vessel 24. The water washing vessel 24 is used as the so-called washing water overflow vessel to wash out hydrofluoric acid on the semiconductor wafers w.

A carrier means 25 is also located at the center (or home position) of the third unit 14 and it is same as those 19 and 22.

A drying vessel 27 in which the so-called IPA drying is carried out is located adjacent to the carrier means 25 at the home position of the third unit 14. Isopropyl alcohol is contained in the drying vessel 27.

Figure 2:
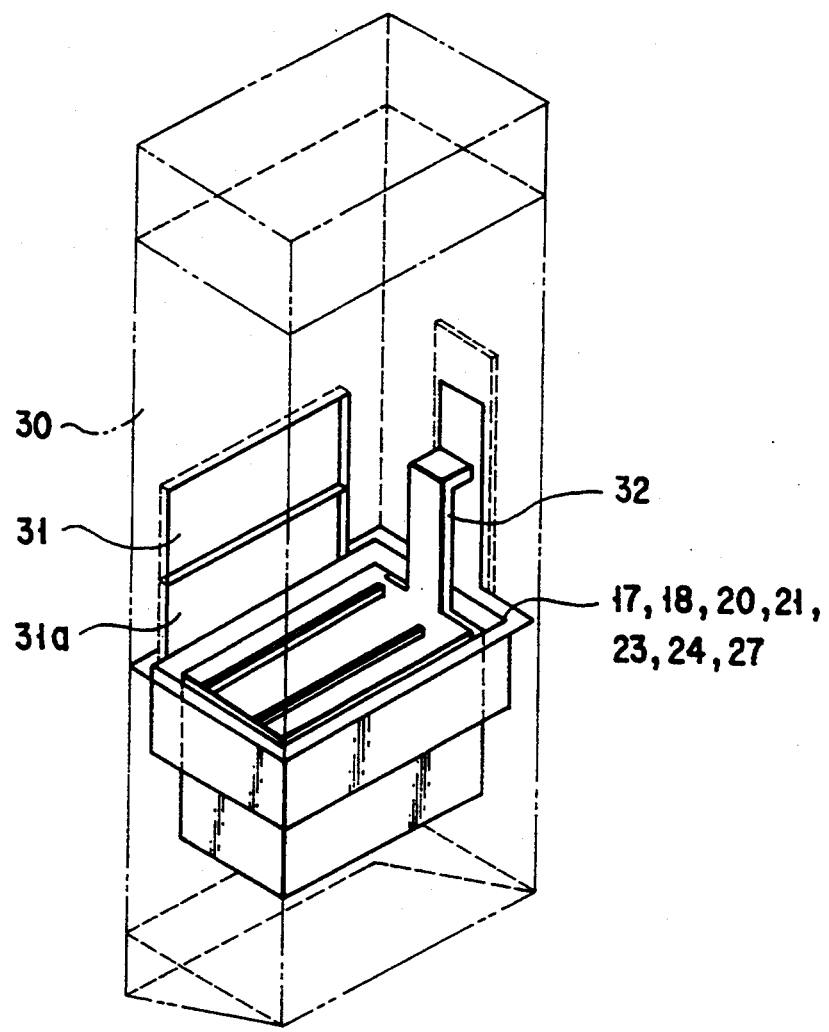
FIG. 2 is a perspective view showing a washing vessel.

As shown in FIG. 2, each of the into-water loaders 17, 18, washing vessels 20, 21, 23, 24 and drying vessel 27 is housed in its corresponding case 30. The case 30 is provided with an opening 31 through which the wafers are carried into and out of the case 30. A lifting shutter 31a is attached to the opening 31. The lower end of the lifting shutter 31a is connected to a lifter (not shown).

A quartz-made wafer boat 32 is housed in each of the into-water loaders 17, 18, washing vessels 20, 21, 23, 24 and drying vessel 27 to serves as a wafers support exclusive to its corresponding loader or vessel.

As shown in FIG. 3, the wafer boat 32 is supported by an arm 33 connected to an elevator means 33a.

As shown in FIGS. 5 through 8, the wafer boat 32 has three parallel support rods 36. Grooves 35 are formed on each of the support rods 36 at a certain pitch and the semiconductor wafers W are held on the support rods 36 in the grooves 35 thereof. Up to fifty sheets of the semiconductor wafers W can be housed in the wafer boat 32 maximum.

Figure 4:
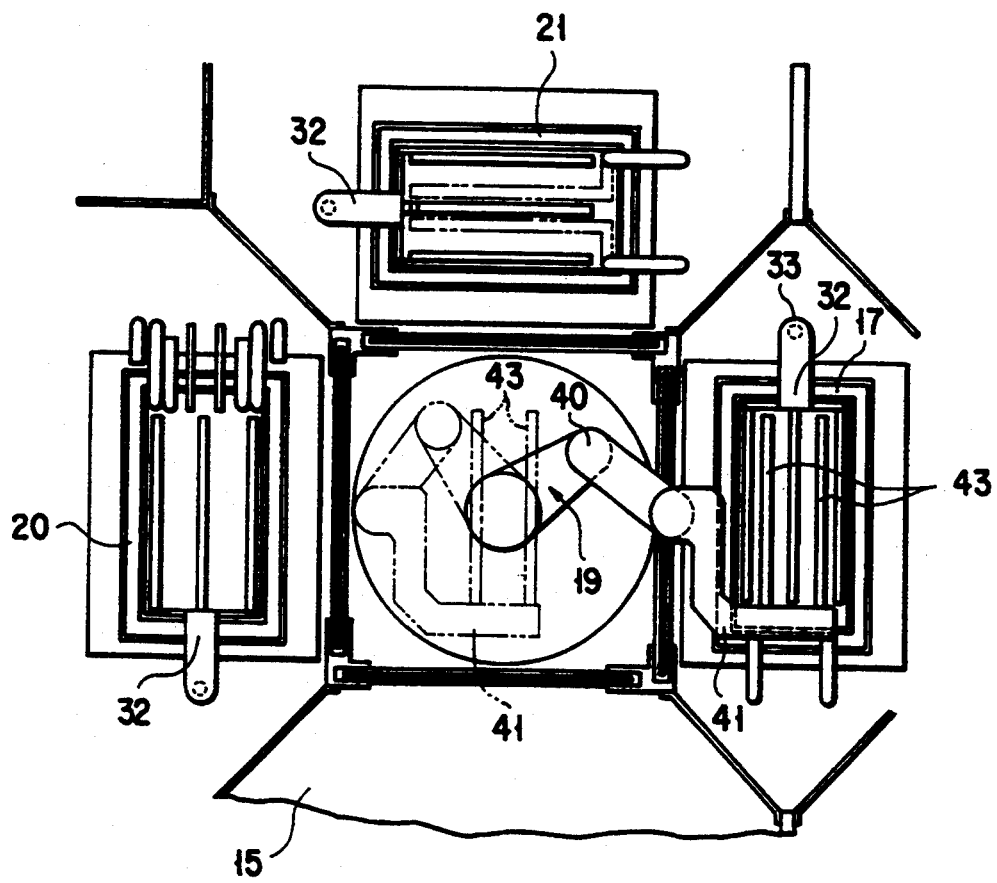
FIG. 4 is a plan view showing a washing unit.
Figure 5:
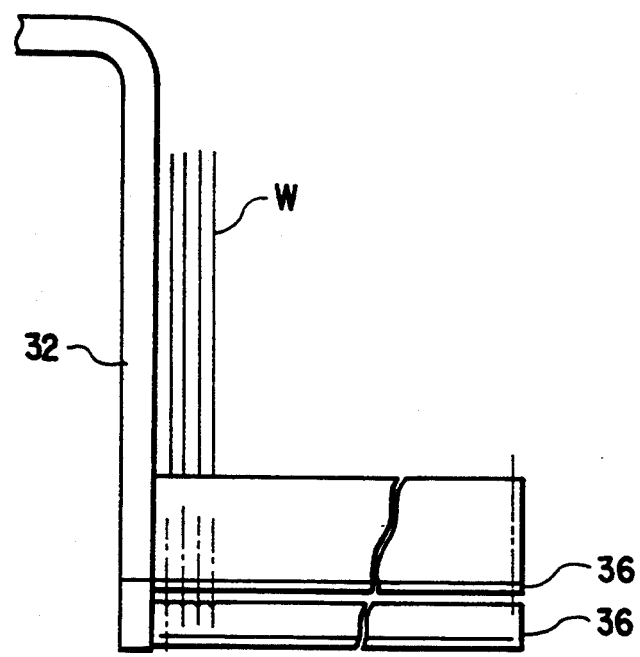
FIG. 5 is a front view showing a wafer boat provided with three supports.

As shown in FIG. 4, the carrier means 19 has the multi-joint arm 40 swingable and extensible on a horizontal plane. When the multi-joint arm 40 is extended, its front end can reach each of the vessels 20, 21 and 17.

Figure 9:
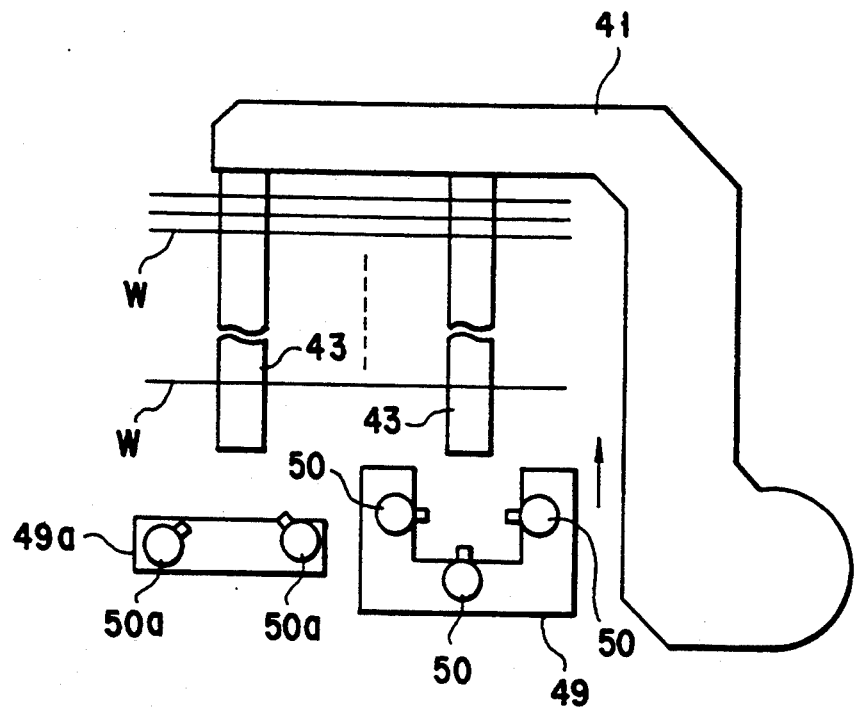
FIG. 9 schematically shows a wafer fork provided with two supports, and air nozzles.
Figure 10:
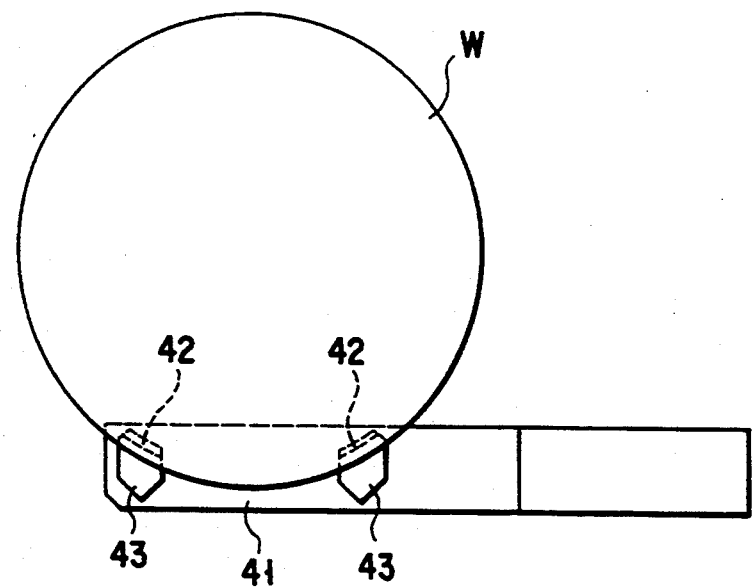
FIG. 10 is a front view showing the wafer fork and the wafer.
Figure 11:
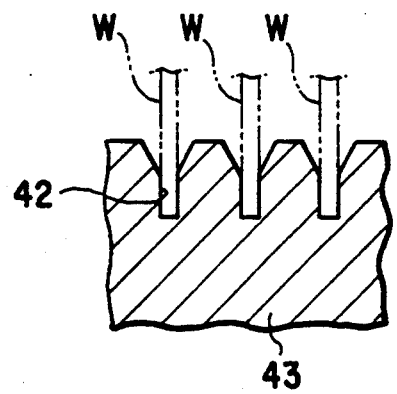
FIG. 11 is a vertically-sectioned view showing a part of the wafer fork.

As shown in FIG. 9, a wafer fork 41 on which the semiconductor wafers are mounted is attached to the front end of the arm 40 of the carrier means 19. The second and third carrier means 22 and 25 are same in structure as the one 19.

As shown in FIGS. 10 through 13, the wafer fork 41 has a pair of support rods 43 parallel to each other. A plurality of grooves 42 are formed on each of the rods 43 at a certain pitch and each of the grooves 42 is shaped to hold the rim portion of the wafer W. Up to fifty sheets of the semiconductor wafers w, maximum, can be supported by the wafer fork 41.

Figure 13:
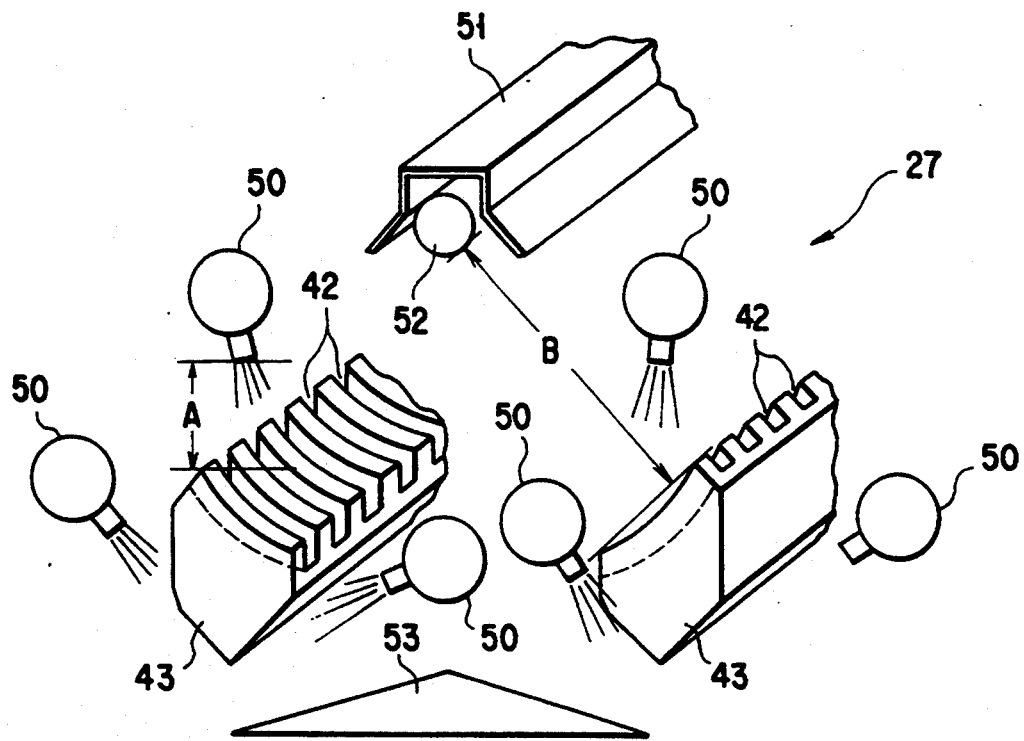
FIG. 13 is a perspective view showing a part of the fork which is being dried.

As shown in FIG. 13, each of the support rods 43 is tapered, gradually becoming narrower as it comes nearer to its lower portion. This is intended to enable liquid adhering to the support rod 43 to be smoothly released from the rod 43 along the tapered portion thereof (or to create excellent water releasability).

It is desirable that the support rods 36 and 43 are made of one of various soft and corrosion-proof materials as fluorine system resin. In a case where the washing process is applied strong acid and alkali, it is desirable that the support rods 36 and 43 are made of resin of the fluorinated ethylene group, particularly tetrafluoroethylene resin or trifluoroethylene resin. Furthermore, in other case where the washing process is applied acid and alkali except for strong acid, it is desirable that the rods 36, 43 are made of poly ether ether ketone resin (PEEK).

As shown in FIG. 13, the washing and drying vessel 27 includes water washing nozzles 50a, the drying air nozzles 50, the IR heater 52 and reflectors 51, 53. The water washing nozzles are four (or two pairs each including two water washing nozzles) and the drying air nozzles 50 are six (or two pairs each including three drying air nozzles). Each of the first and second units 12 and 13 also includes these same water washing and drying nozzles.

As shown in FIG. 9, three drying air nozzles 50 are attached to a nozzle unit 49 and their air jetting openings of the nozzles 50 are directed to the center of the nozzle unit 49. Two water washing nozzles 50a are attached to a nozzle unit 49a and their water jetting openings are directed to the center of the nozzle unit 49a. A pair of nozzle unit 49 and a pair of nozzle unit 49a are arranged above the fork 41, respectively. Each of the nozzles 50 and 50a is communicated with an air or water supply source (not shown) which has a pressure regulating valve.

The nozzle units 49 and 49a are connected to a scanning drive means (not shown) which is backed up by a control system. The scanning drive means can move the nozzle units 49 and 49a along the longitudinal axis of the wafer fork 41. Although the nozzles 50 and 50a have been moved along the support rods 43 in this example, rod-like nozzle units each having a plurality of nozzle openings may be arranged along the support rods 43.

The IR heater 52 extends along the support rods 43 of the fork 41 and it is located between the paired upper and lower reflectors 51 and 53. When it is switched on, it radiates infrared rays.

The upper reflector 51 encloses the upper half of the IR heater 52. The lower reflector 53 is located below and between the support rods 43 and separated from the IR heater 52 by a certain distance. The lower reflector 53 is an SiO₂ plate coated with tantalum. The lower reflector 53 formed in this manner efficiently reflects infrared ray radiated from the IR heater 52 to heat and dry the underside of each of the support rods 43.

As shown in FIG. 13, the interval A of each of the air nozzles 50 relative to its corresponding support rod 43 is about 15 mm. The interval B of the IR heater 52 relative to each of the support rods 43 is about 50 mm.

Although each of the first and second units 12 and 13 has included only the water washing and drying nozzles, it may include the IR heater 52, too.

Figure 14:
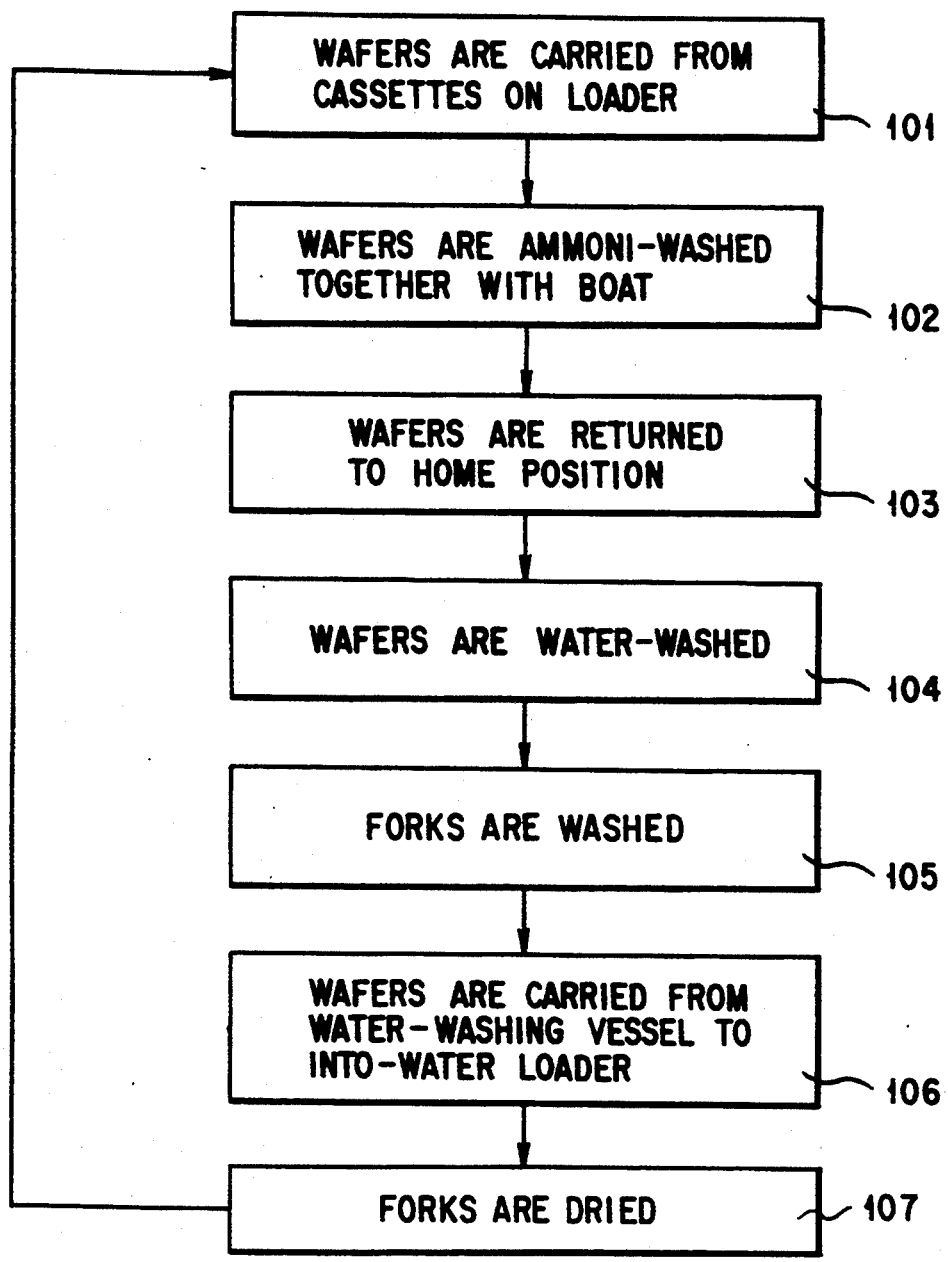
FIG. 14 is a flow chart showing the first half of the washing process.

The first half of a washing or cleaning process will be described with reference to FIG. 14.

Cassettes 29 are placed on the loader 15 by a carrier robot (not shown). Orientation flats of the semiconductor wafers w in the two cassettes 29 placed on the loader 15 at certain positions thereof are aligned by an alignment means (not shown) on the loader 15. The semiconductor wafers W in the cassettes 29 are then pushed upward from below, for example, and picked up out of the cassettes 29. The arm 40 of the carrier means 19 is extended and fifty sheets of the wafers W are transferred from the cassettes onto the fork 41. The wafers W are carried from the loader 15 to the home position of the first unit 12 while shrinking the arm 40 (Step 101).

The arm 40 is swung to position the fork 41 in front of the opening 30 of the first washing vessel 21. The shutter 31a is opened.

Figure 7:
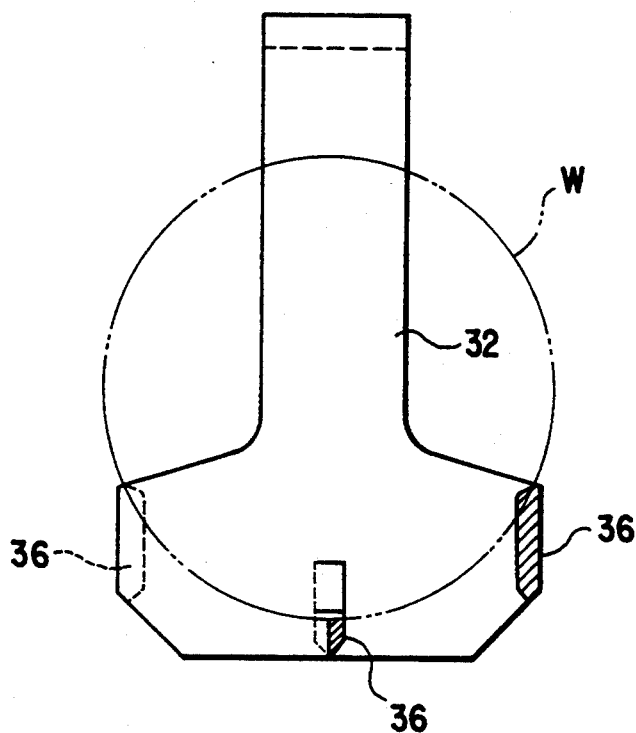
FIG. 7 is a vertically-sectioned view showing the boat and wafers pulled out of the vessel.
Figure 7:
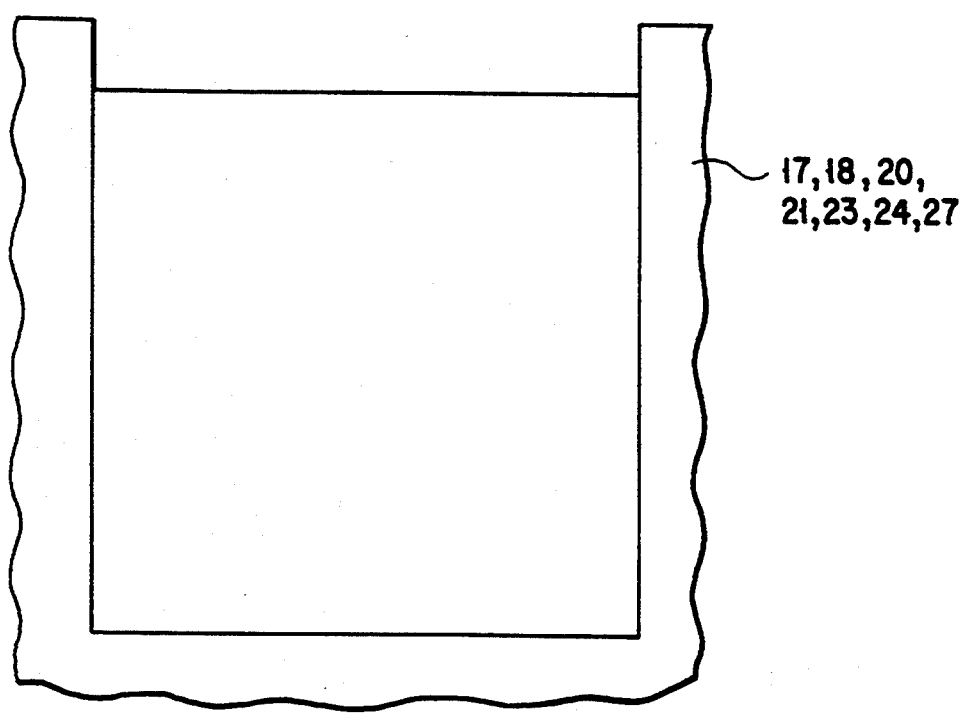

The arm 40 is inserted into the vessel 21 through the opening 31 and the wafers w are transferred from the fork 41 onto the boat 32, as shown in FIG. 7. The fork 41 is pulled out of the vessel 21, the shutter 31a is closed and the wafer boat 32 is lowered. As shown in FIG. 8, the wafers W are immersed together with the boat 32 in ammonia solution in the washing vessel 21 for a certain time (Step 102).

The wafer boat 32 is taken out from the ammonia solution in the first washing vessel 21 and transferred from the boat 32 onto the fork 41. The wafers on the fork 41 are returned to the home position of the first unit 12 (Step 103).

The arm 40 is swung to position the fork 41 in front of the opening of the water washing vessel 20. The wafers W are transferred from the fork 41 onto the boat 32. The wafers W are lowered together with the boat 32 and immersed in water in the water washing vessel 20. The boat 32 is taken out from the water washing vessel 20 (Step 104).

The support rods 43 of the fork 41 are washed and dried while the wafers W are kept in the water washing vessel 20 (Step 105). While scanning the washing nozzles 50 at a speed of 10 mm/second, pure water is jetted to the wafer support rods 43 through the nozzles 50 at a flow rate of 0.7–10 liters/minute.

The wafers W are transferred from the boat 32 to the fork 41 and carried to the into-water loader 17 (Step 106). Next, the support rods 43 of the fork 41 are dried. Dry air or nitrogen gas is jetted to the support rods 43 through the drying nozzles 50a. The dry air or nitrogen gas may be heated. The air pressure is set 4.5 kg/cm² and the flow rate of air is set 132 liters/minute.

Next wafers W are carried from cassettes 29 on the loader 15 to the first unit 12 by the carrier means 19.

The second half of the washing process will be described with reference to FIG. 15.

The wafers W are carried from the into-water loader 17 to the home position of the second unit 13 by the carrier means 22 (Step 111).

The wafers W are transferred from the fork 41 to the boat in the washing vessel 23. The boat 32 is lowered and the wafers w are immersed together with the boat 32 in hydrofluoric acid solution in the vessel 23 (Step 112).

The wafers W are pulled out of hydrofluoric acid solution, transferred from the boat 32 to the fork 41 and returned to the home position of the unit 13 (Step 113).

The arm 40 is swung to position the fork 41 in front of the water washing vessel 24. The wafers W are transferred from fork 41 to the boat 32 and the boat 32 is lowered to immerse the wafers W in water in the water washing vessel 24 (Step 114).

While the wafers W are being washed, water is jetted to the support rods 43 of the fork 41 through the nozzles 50a to wash out hydrofluoric acid on the wafers W. Dry air is then blown to the support rods 43 through the nozzles 50 to dry the rods 43 (Step 115). The water washing and drying conditions are same as those at the step 105.

The wafers W are transferred from the boat 32 to the cleaned fork 41 and then from the water washing vessel 24 to the into-water loader 18 (Step 116).

The wafers W are further carried from the into water loader 18 to the home position of the third unit 14 (Step 117) and then into the drying vessel 27 by the carrier means 25.

The wafers W are dried, as described above, by isopropyl alcohol in the drying vessel 27 (IPA drying). The fork 41 of the carrier means 25 is inserted into the drying vessel 27 this time and washed and dried by the nozzles 50, 50a and the IR heater 52 (Step 118).

When the drying step relative to the wafers W is finished in the drying vessel 27, the wafers w are received by the cleaned fork 41 and carried to the cassettes 29 on the unloader 16 (Step 119). A series of the processing steps 101–119 (or one cycle) starting from the loader 15 and ending with the unloader 16 takes a total time of three minutes 48 seconds.

According to the above-described washing apparatus 10, the semiconductor wafers w can be washed and dried without any cassette. Therefore, processing solutions such as ammonia and hydrofluoric acid in the washing vessels cannot be contaminated by the cassette and their lives can be thus made longer.

Further, the wafers w which have been dried are usually unloaded by the fork 41 which has been cleaned in the washing and drying vessel 27. This can prevent any processing liquid and particles from adhering to the wafers W.

Furthermore, the base of each of the support rods 43 of the fork 41 is tapered. Therefore, liquid adhering to the support rods 43 can be caused to quickly drop from them, thereby making it easier to wash or dry them.

Although the wafer boat 32 which serves as the wafer support means exclusive to its corresponding vessel has been attached to and lifted by the elevator means 33a in the above-described example, it may be fixed to its corresponding vessel. It is needed, however, in this case that the carrier means 25 serves to hold or support the wafers W and also to move them up and down. When the carrier means 25 serves in this manner, the wafers W can be carried among the vessels.

Although the fork 41 has been washed and dried at the home position of its corresponding unit in the above-described example, it may be washed and dried not at the home position but just above its corresponding water washing vessel 20, 24 or 27.

Although the linear IR heater 52 has been arranged parallel to the wafer support rods 43 in the above-described example, it may be arranged perpendicular to the rods 43.

Although the semiconductor wafers W have been washed in the above-described example, LCD and print substrates and others can be washed.

According to the above-described washing or cleaning apparatus of the present invention, each washing vessel includes the means which enables matters to be supported and washed, and the matters to be washed are loaded on and unloaded from this support means by the carrier means. This makes it unnecessary for any cassette to be used at the process of washing the matters such as the semiconductor wafers.

Further, washing solution usually adheres to the carrier means because the carrier means supports the matters such as the semiconductor wafers which have been soaked with the washing solution. According to the above-described washing apparatus of the present invention, however, it includes the means for washing and drying the carrier means. This can prevent the semiconductor wafers, for example, which have been washed and dried from being contaminated by the carrier means.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of washing a wafer group consisting of a plurality of semiconductor wafers, comprising the steps of:
    preparing a treatment vessel containing a treatment solution for washing or water-washing said wafer group, first support means for supporting the wafer group to be immersed in the solution, second support means for loading/unloading the wafer group on/from the first support means, water-washing means for water-washing the second support means, and drying means for drying the second support means with a drying gas;
    supporting the wafer group by the second support means;
    carrying the wafer group into said treatment vessel;
    transferring the wafer group from the second support means to the first support means in the treatment vessel;
    immersing the wafer group in the treatment solution together with the first support means;
    pulling the wafer group up from the treatment solution;
    transferring the wafer group from the first support means to the second support means;
    carrying the wafer group to an other place outside of the treatment vessel together with the second support means;
    transferring the wafer group from the second support means to said other place;
    spraying water onto the second support means while said second support means does not support wafers and is held stationary, by moving said water-washing means along a supporting rod of the second support means;
    blowing a drying gas against the second support means while said second support means does not support wafers and is held stationary, by moving said drying means along a supporting rod of the second support means; and
    allowing a next wafer group to be supported by the resultant clean second support means support means excluding the substrates by means of the washing means; and
    drying the second support means excluding the substrates by means of the drying means.

2. A washing method according to claim 1, further comprising the step of heat-drying the supporting rod of the second support means by use of a linear IR heater of the drying means.

3. A washing method according to claim 1, further comprising the step of moving the water-spray nozzles along with a supporting rod of the second support means so as to spray water into a groove made in the supporting rod for the purpose of supporting a wafer, and then moving the air injection nozzles along with a supporting rod of the second support means so as to inject air onto a groove made in the supporting rod for the purpose of supporting a wafer.

4. A washing method according to claim 3, wherein a lower portion of the supporting rod is formed so as to taper towards an end, and water is sprayed and dry air is injected towards the lower portion of the supporting rod.

5. A washing method according to claim 3, wherein there are two of the supporting rods, and dry air is injected from three air injection nozzles of each supporting rod.

6. A method of washing a wafer group consisting of a plurality of semiconductor wafers, comprising the steps of:
    preparing a treatment vessel containing a treatment solution for washing or water-washing said wafer group, first support means for supporting the wafer group to be immersed in the solution, second support means for loading/unloading the wafer group on/from the first support means, water-washing means for water-washing the second support mean, and drying means for drying the second support means with a drying gas;
    supporting the wafer group by the second support means;
    carrying the wafer group into said treatment vessel;
    immersing the wafer group in the treatment solution together with the second support means;
    transferring the wafer group from the second support means to the first support means in the treatment vessel;
    transferring the wafer group from the first support means to the second support means in the treatment vessel;
    pulling the wafer group up from the treatment solution;
    carrying the wafer group to an other place outside of the treatment vessel together with the second support means;
    transferring the wafer group from the second support means to said other place;
    spraying water onto the second support means while said second support means does not support wafers and is held stationary, by moving said water-washing means along a supporting rod of the second support means;

blowing a drying against the second support means while said second support means does not support wafers and is held stationary, by moving said drying means along a supporting rod of the second support means; and allowing a next wafer group to be supported by the resultant clean second support means.

* * * * *